United States Patent
Uruno et al.

(10) Patent No.: US 7,051,724 B2
(45) Date of Patent: May 30, 2006

(54) CAR-MOUNTED IGNITER USING IGBT

(75) Inventors: Junpei Uruno, Tokai (JP); Yasuhiko Kouno, Naka (JP)

(73) Assignee: Hitachi, Ltd. (JP)

( * ) Notice: Subject to any disclaimer, the term of this patent is extended or adjusted under 35 U.S.C. 154(b) by 0 days.

(21) Appl. No.: 10/481,637

(22) PCT Filed: Dec. 13, 2002

(86) PCT No.: PCT/JP02/13067

§ 371 (c)(1),
(2), (4) Date: Dec. 22, 2003

(87) PCT Pub. No.: WO2004/055361

PCT Pub. Date: Jul. 1, 2004

(65) Prior Publication Data

US 2004/0216724 A1    Nov. 4, 2004

(51) Int. Cl.
*F02P 3/00*    (2006.01)
(52) U.S. Cl. ............. 123/644; 123/650; 123/651; 123/652
(58) Field of Classification Search ........... 123/644, 123/650, 651, 652
See application file for complete search history.

(56) References Cited

U.S. PATENT DOCUMENTS

| 5,634,453 A * | 6/1997 | Taruya et al. ............ 123/651 |
| 5,775,310 A * | 7/1998 | Ito et al. ............... 123/644 |
| 6,336,448 B1 | 1/2002 | Furuhata |
| 2004/0011343 A1* | 1/2004 | Nobe et al. ............. 123/644 |

FOREIGN PATENT DOCUMENTS

| JP | 9-79126 | 3/1997 |
| JP | 9-280147 | 10/1997 |
| JP | 11-294309 | 10/1999 |
| JP | 2002-295354 | 10/2002 |

* cited by examiner

*Primary Examiner*—Erick Solis
(74) *Attorney, Agent, or Firm*—Dickstein Shapiro Morin & Oshinsky LLP

(57) ABSTRACT

An igniter of the present invention has an insulated gate semiconductor device having a collector terminal, an emitter terminal and a gate terminal, a current control circuit which limits current by controlling voltage at the gate terminal when current for flowing through the insulated gate semiconductor device exceeds a fixed value, a voltage monitor circuit for detecting a potential of the collector, and a control current adjusting circuit for controlling current which flows through the gate terminal by receiving output from the voltage monitor circuit.

12 Claims, 10 Drawing Sheets

"PRIOR ART"

CAR-MOUNTED IGNITER USING IGBT

TECHNICAL FIELD

The present invention relates to an igniter, which is an automotive ignition device, and an insulated gate semiconductor device to be used for it, and more particularly to the insulated gate semiconductor device having a constant current control function.

BACKGROUND ART

Currently, for a switch for the igniter, which is an automotive ignition device, there have been widely used insulated gate bipolar transistors (IGBT), and in particular, in recent years, IGBTs for igniters, each incorporating a protection function therein, have been increasing. The IGBT incorporating the protection function has been disclosed in Japanese Patent Laid-Open No. 9-280147/1997.

In the Japanese Patent Laid-Open No. 9-280147/1997, there has been disclosed an inhibition method for current vibration of the IGBT incorporating a current limiting function. FIG. 2 shows the IGBT and its current limiting circuit disclosed in the Japanese Patent Laid-Open No. 9-280147/1997. In FIG. 2, reference numeral 201 designates a battery; 202, an ignition coil; 203, IGBT; 204, a spark plug; 205, a resistor; 206, a high voltage constant current element; 207, a Zener diode; 208, a diode; 209, 210, a resistor; 211, a capacitor; 212, a transistor; 213, a resistor; and 214, a drive circuit.

The description will be made of an operation of this circuit. In the beginning, a state in which the IGBT203 is off will be considered. In this state, no signal is outputted from the drive circuit 214, but a gate of an IGBT 203 is at 0 V. On the other hand, since the IGBT203 is off, there is no current flowing through a so-called main circuit reaching from the battery 201 to the IGBT204 through the ignition coil 202, but a battery voltage is applied between collector and emitter of the IGBT204.

Next, the description will be made of an on-state of the IGBT. When an on-signal from the drive circuit 214 is inputted into a gate of the IGBT204, the IGBT203 is turned on, and current starts to flow through a main circuit. Next, when the IGBT is turned off again, as high voltage as hundreds volt is developed across a primary terminal of the ignition coil 202 because the current of the main circuit is abruptly cut off. This voltage is raised to tens of thousands volts and conducted on a secondary terminal side of the ignition coil to discharge the spark plug.

The circuit is described to have two types of protection circuits. One of them is an overvoltage protection circuit. In a case where when the IGBT shifts from an on-state to an off-state, discharge cannot be performed because of some trouble or other with the spark plug, voltage at the primary terminal of the ignition coil 202 continues to be raised. For this reason, there is, between collector and gate of the IGBT, provided the Zener diode 207 which limits the voltage when the predetermined voltage is exceeded.

The other type is a current limiting circuit. The maximum value of current flowing through the IGBT becomes higher in proportion to a time period during which the IGBT is on by the drive circuit, and when this time period becomes long because of some trouble or other, there may be cases where a large current flows through the IGBT. Thus, there is provided a function which when the current through the IGBT exceeds a predetermined current value, voltage to be developed across the resistor 205 causes the transistor 212 to turn on for reducing gate voltage of the IGBT, and limits the current flowing through the IGBT.

Although this current limiting circuit had a problem that current vibration is prone to occur, in the Japanese Patent Laid-Open No. 9-280147/1997, by adding a circuit for supplying low current from the collector to the gate during the current limiting operation, that is, the high voltage constant current element 206 and the resistor 209, this problem has been solved.

In the Japanese Patent Laid-Open No. 9-280147/1997, however, since the structure is arranged such that current is supplied from the collector to the gate in order to inhibit the vibration, there is a problem that leakage current from the collector to the gate is high. This leakage current is current that continues to flow from the battery in a state in which the IGBT is off, or current that flows from the collector to the gate when high voltage is applied, such as during discharge from the spark plug.

In order to reduce the leakage current, an amount of current supply from the collector to the gate can be reduced, and on the other hand, in order to inhibit the current vibration, it is necessary to supply current to some extent from the collector to the gate. The current to some extent is current enough to, when vibration of gate voltage which causes the current vibration is going to occur, inhibit this vibration, and this current is determined by impedance of the drive circuit, gate-emitter capacity of IGBT, or the like. In the case of a particularly large IGBT chip, since the gate-emitter capacity also becomes large, there arises the need for supplying a large current responsive thereto from the collector, and the leakage current is also increased. When this leakage current is increased, loss in the off-state is increased, resulting in a problem that electricity stored in the battery is consumed. Also, during ignition to the spark plug, arc energy is reduced by an amount corresponding to the loss due to the leakage current, which will cause automotive combustion efficiency to be deteriorated among others. Further, it will become impossible to check collector-emitter leakage current, which is to be performed during selection of an initial failure of the IGBT, and it has also a problem of reliability degradation.

It is an object of the present invention to solve the above-described problems and to provide a highly reliable ignition circuit for an internal combustion engine with little loss.

DISCLOSURE OF THE INVENTION

An igniter according to the present invention has an insulated gate semiconductor device having a collector terminal, an emitter terminal and a gate terminal, a current control circuit which limits current by controlling voltage at the gate terminal when current for flowing through the insulated gate semiconductor device exceeds a fixed value, a voltage monitor circuit for detecting potential at the collector, and a control current adjusting circuit for controlling current which flows through the gate terminal by receiving output from the voltage monitor circuit.

According to an igniter of the present invention, since from the collector terminal, only a signal based on the voltage monitor circuit is used, and vibration inhibition current is supplied from the gate in response to this signal, it is possible to reduce the collector leakage current, and to reduce loss due to the leakage current. Also, since when the leakage current can be reduced, the leakage current from the IGBT can be inspected, the reliability of the IGBT will be improved.

BEST MODE FOR CARRYING OUT THE INVENTION

Hereinafter, with reference to the drawings, the description will be made of embodiments according to the present invention in details.

(First Embodiment)

Figure 1:
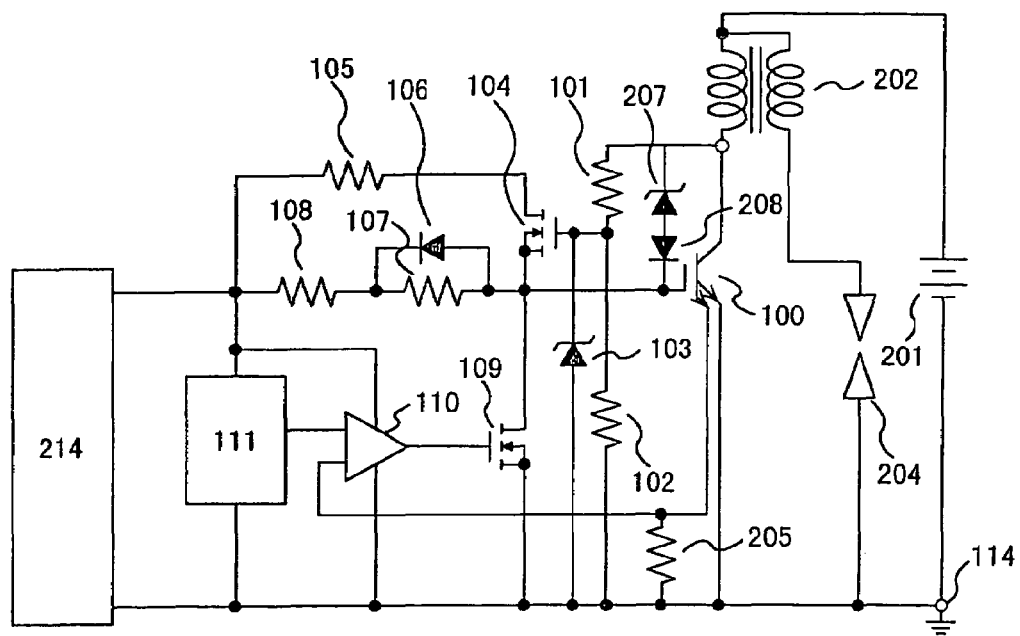
FIG. 1 is a circuit diagram showing an igniter according to a first embodiment.
Figure 2:
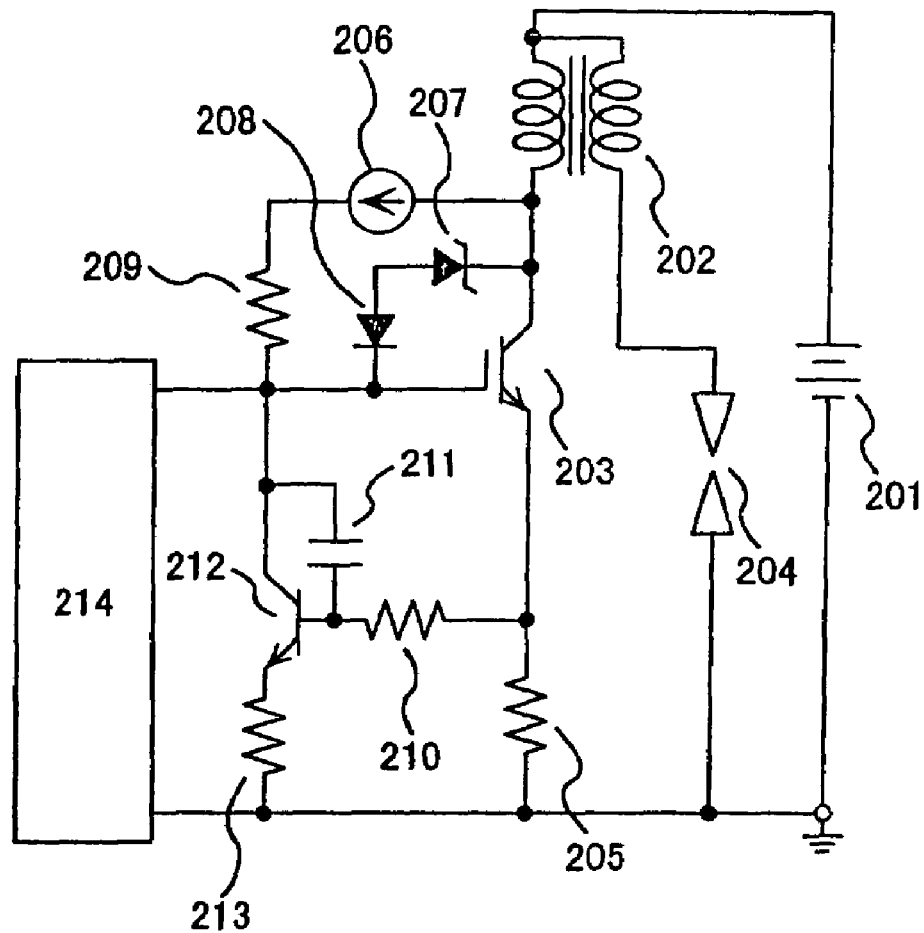
FIG. 2 is a circuit diagram showing an igniter according to a conventional technique.

FIG. 1 shows an equivalent circuit of an igniter of the present embodiment. In FIG. 1, component elements identical to those in FIG. 2 are designated by the identical reference numerals. Structure in FIG. 1 will be described. The battery 201, a primary coil of the ignition coil 202 and an IGBT100 having a current detection terminal are connected in series. A secondary side of the ignition coil 202 is connected to the spark plug 204. To a current detection terminal of the IGBT100, a resistor 205 for current detection is connected, and a node between the IGBT100 and the resistor 205 is connected to a comparator 110. To the comparator 110, there is also inputted a signal from a constant-voltage regulated power supply 111 for generating reference voltage. On the other hand, output from the comparator 110 is connected to a gate of MOSFET 109 connected to between the gate and the emitter of the IGBT. The IGBT100 gate is connected to the gate terminal through resistors 107 and 108. To the resistor 107, diodes 106 are connected in parallel. A series connection circuit of resistors 101 and 102 is connected in parallel with the IGBT100, and a middle point of these series-connected resistors is connected to a gate of a MOSFET 104. A source of the MOSFET 104 is connected to the IGBT100 gate, and the drain is connected to a drive circuit 214 through a resistor 105.

In the present embodiment, the vibration inhibition current has been supplied from the drive circuit in synchronism with the collector voltage. This operation will be described with reference to the equivalent circuit diagram of FIG. 1 and the operating waveform view of FIG. 3.

In the beginning, the description will be made of a state in which the IGBT is off. The output of the drive circuit is at 0 V, and the IGBT is off. At this time, battery voltage has been applied to both ends of the IGBT100, and a voltage obtained by dividing the voltage between resistors 101 and 102 is applied to the gate of the MOSFET 104, and the MOSFET 104 is on. Since the input power is at 0 V, however, no current flows through the MOSFET 104.

Figure 3:
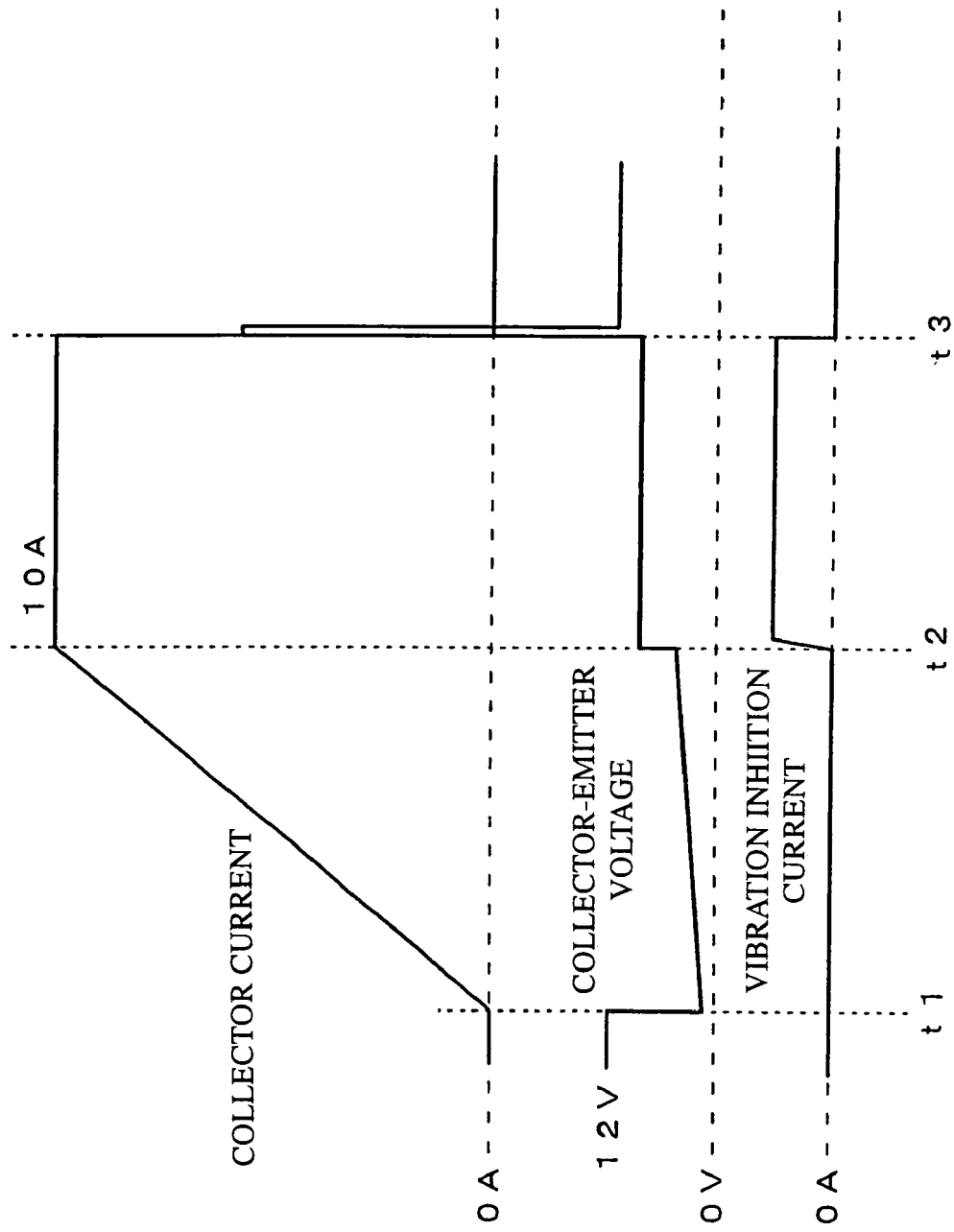
FIG. 3 shows operating waveform of an igniter according to the first embodiment.

Next, the description will be made of a state in which the IGBT has turned on at time t1. In FIG. 3, when driving voltage is outputted to the gate from the drive circuit at time t1, the IGBT is turned on so that current flows from the battery to the IGBT through the primary side of the ignition coil. When the current flows through the IGBT100, the collector voltage is abruptly reduced to a few volts. At this time, voltage at the node of the resistors 101 and 102 becomes a very low value, and since it has been set to become the threshold voltage of the MOSFET 104 or less, the MOSFET 104 does not operate.

When the IGBT continues to increase its current value in the on-state and exceeds a predetermined current value, detection voltage to be developed across the resistor 205 becomes higher than reference voltage to be generated by the constant-voltage regulated power supply 111, the comparator 110 outputs a signal, and the MOSFET 109 is turned on. When the MOSFET 109 is turned on, the gate voltage of the IGBT is reduced and any increase in the current of the IGBT is limited. When the collector current is limited to a fixed value, the collector voltage is abruptly raised to cause vibration. According to the present embodiment, however, when the collector voltage is raised, potential at the middle point between resistors 101 and 102 is also increased to turn the MOSFET 104 on. When the MOSFET 104 is turned on, current flows from the gate terminal to the IGBT gate through the resistors 107 and 108 and the diode, raises the gate voltage, and inhibits the rise in the collector voltage to prevent the vibration.

Figure 4:
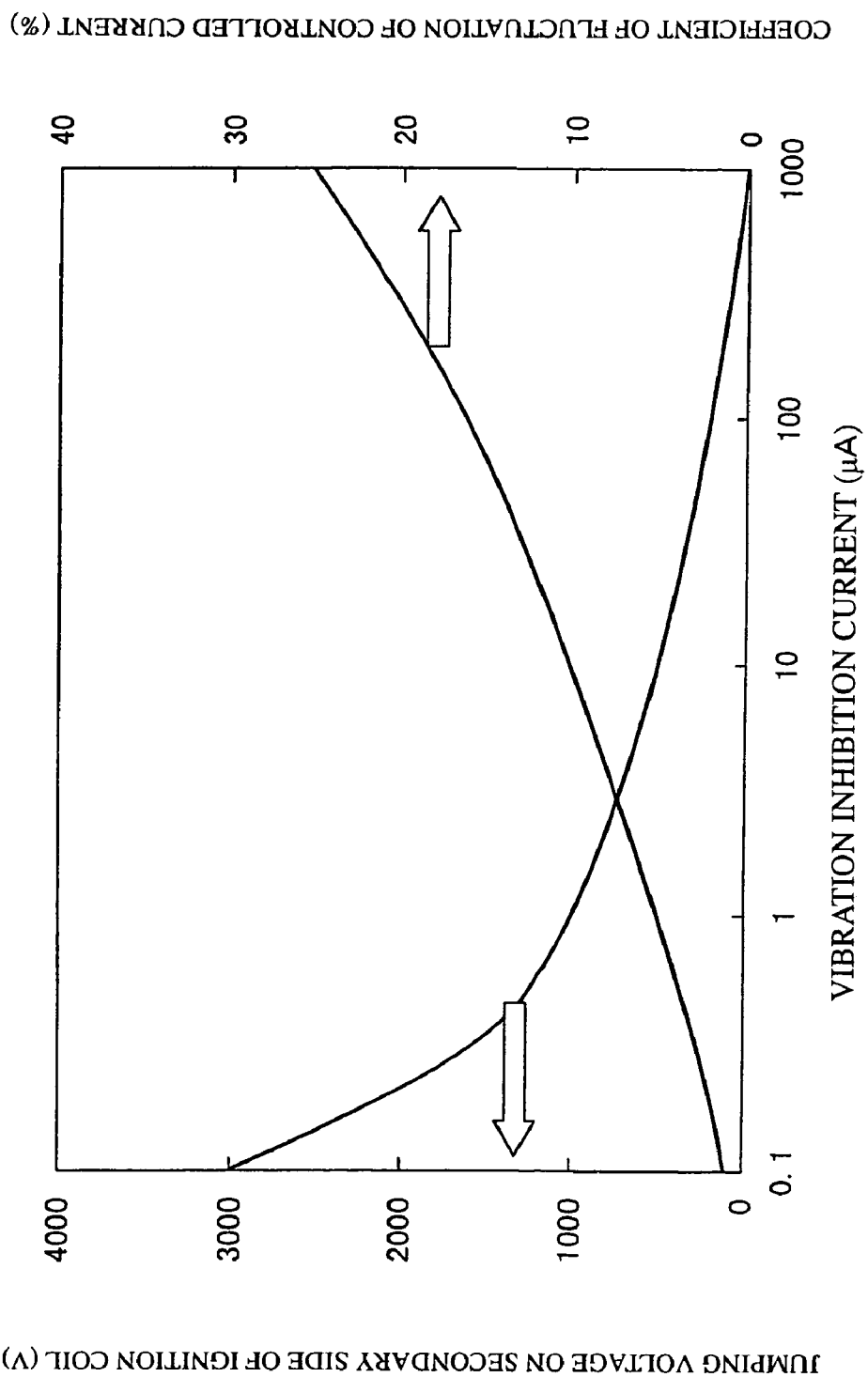
FIG. 4 is a graph showing circuit conditions of a vibration inhibition circuit according to the first embodiment.

The larger the vibration inhibition current to be supplied at this time is, the higher the vibration inhibition effect is. When the supply current is too large, however, the IGBT gate voltage is excessively raised, and therefore, it becomes impossible to control to a fixed current. According to the inventor's experiment, the minimum and maximum values of output current from the MOSFET 109, which is a control circuit of the gate current are such a range as shown in FIG. 4. FIG. 4 shows relationship between the vibration inhibition current to be supplied from the gate terminal through the MOSFET 104 and voltage to be developed on the secondary side of the ignition coil. When the vibration inhibition current is raised, it is possible to inhibit voltage to be developed on the secondary side of the ignition coil. When this voltage on the secondary side exceeds 1000 V, the ignition plug discharges to cause a malfunction of the engine. For this reason, the vibration inhibition current is preferably raised to exceed 1 µA. On the other hand, when this supply current is further increased, the IGBT gate voltage itself will be raised and it will become difficult to perform constant current control with great precision.

Next, the description will be made of so-called during turning-off, that is, the IGBT goes into an off-state from an on-state. When the input voltage is set to 0 V or negative voltage in order to turn the IGBT off, the IGBT becomes off to reduce the collector current. When the collector current starts to be reduced, high voltage is developed on the collector terminal side of the IGBT because of an inductance component of the ignition coil to be applied to the IGBT. The voltage applied increases potential at the middle point between resistors 101 and 102 to turn the MOSFET 104 on. Since, however, the input voltage has been set to 0 V or negative voltage at this time, even if the MOSFET 104 is turned on, no current flows from the gate terminal to the IGBT gate, but there is no possibility that the IGBT malfunctions.

According to the present invention as described above, only at the commencement of current limiting at which vibration occurs, current corresponding to the rise in the collector voltage is supplied to the IGBT gate from the drive circuit, whereby the vibration can be inhibited. With this structure, in order to inhibit the vibration, current to be supplied to the IGBT is supplied from the gate instead of being supplied from the collector, whereby the collector leakage current can be made into exceedingly small one. Since the collector leakage current can be reduced, it becomes possible to select by means of the collector leakage current of the IGBT body, resulting in improved responsibility of the IGBT.

(Second Embodiment)

Figure 5:
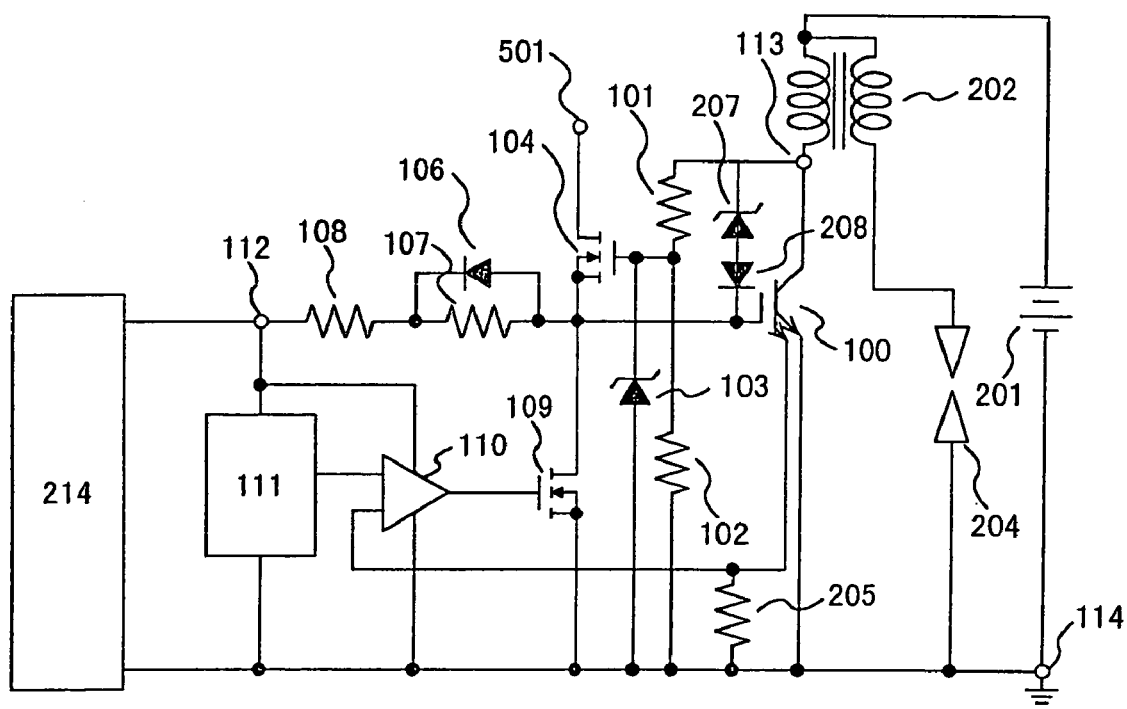
FIG. 5 is a circuit diagram showing an igniter according to a second embodiment.

FIG. 5 shows a circuit diagram of an igniter of the present embodiment. In FIG. 5, component elements identical to those in FIGS. 1 to 4 are designated by the identical reference numerals. In the present embodiment, there has been provided a terminal 501 for supplying vibration inhibition current from external power supply. In a method for supplying vibration inhibition current from the drive circuit, there may be cases where when the driving voltage drops for some reason or other, it becomes impossible to supply sufficient vibration inhibition current. In particular, when the IGBT is directly driven by a microcontroller or the like in order to improve the control responsivity of the IGBT, the driving voltage is as low as about 5 V, and it is difficult to supply the vibration inhibition current. According to the present embodiment, since sufficient vibration inhibition current can be supplied at all times by supplying the vibration inhibition current from another external power supply, it is possible to implement a stable vibration inhibition operation.

(Third Embodiment)

Figure 6:
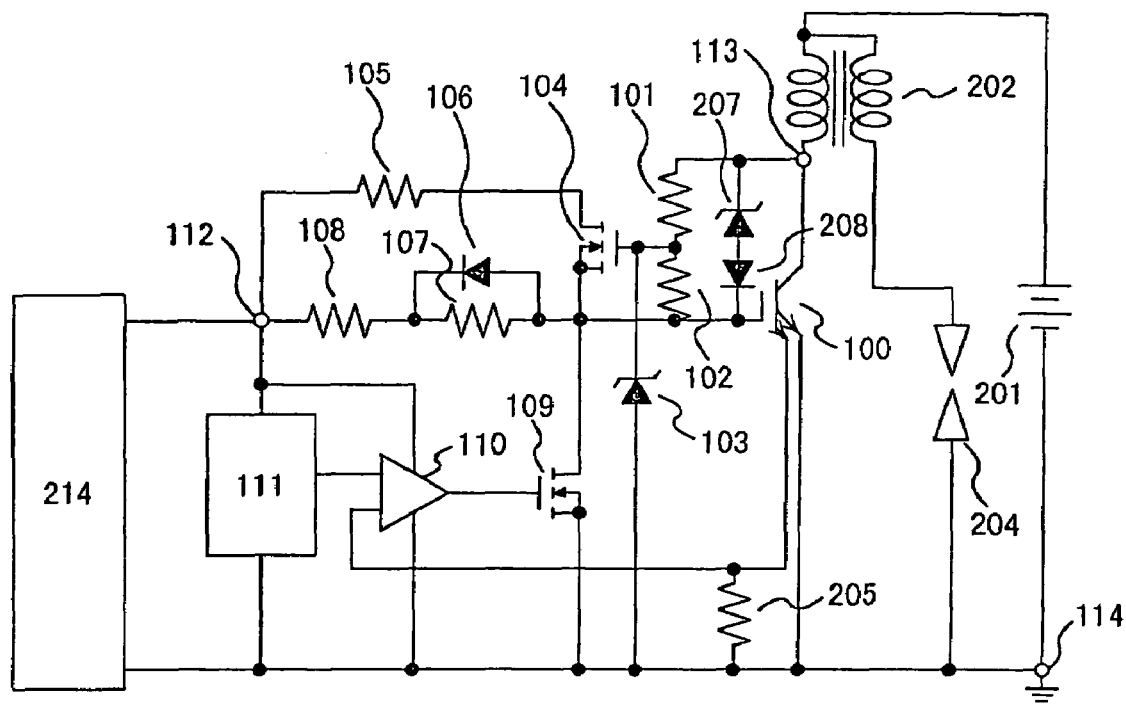
FIG. 6 is a circuit diagram showing an igniter according to a third embodiment.

FIG. 6 shows an igniter of the present embodiment. In FIG. 6, component elements identical to those in FIGS. 1 to 5 are designated by the identical reference numerals. In the present embodiment, it has been rendered capable of supplying current from the collector to the gate by connecting the resistors 101 and 102 to the IGBT gate. With such structure, since the vibration inhibition current is also directly supplied from the collector in addition to supplying of the vibration inhibition current from the drive circuit, even when the driving voltage drops and supply of the vibration inhibition current is reduced as described in the second embodiment, a stable vibration inhibition operation can be maintained because current can be directly supplied from the collector. Also, since the structure is arranged such that the greater part of the vibration inhibition current is supplied from the drive circuit unlike the conventional technique, a sufficiently small amount of supply current from the collector to the gate will suffice, and therefore, the collector leakage current can be reduced to a minimum. Also, according to the present embodiment, the vibration inhibition current is directly supplied from the resistors 101 and 102 during some delay time which occurs on the MOSFET 104, whereby it is possible to implement an operation quick in time response.

(Fourth Embodiment)

Figure 7:
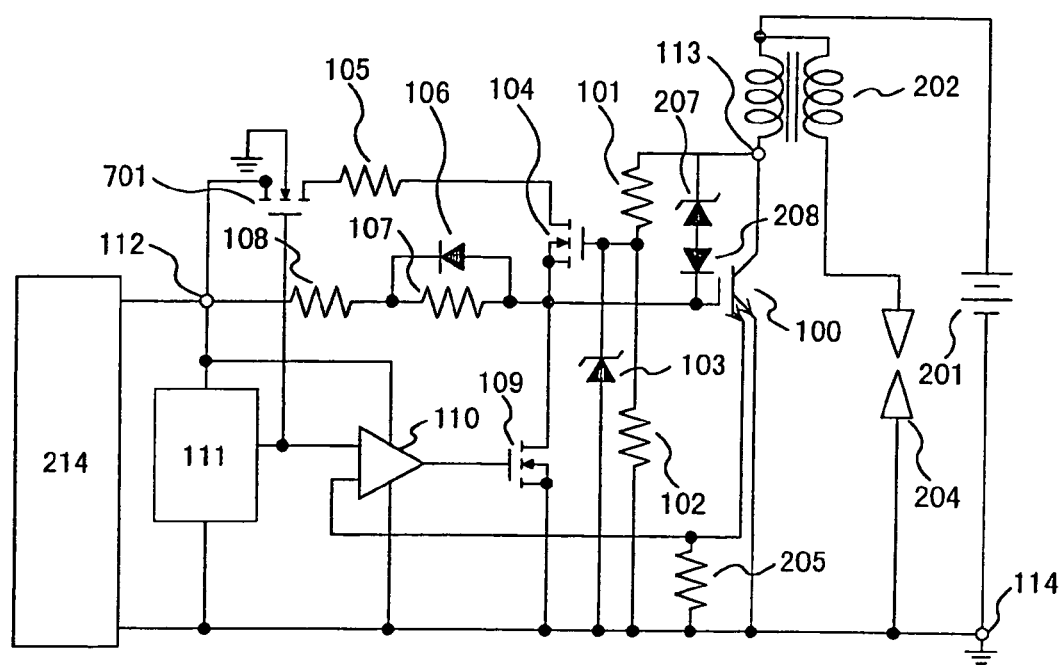
FIG. 7 is a circuit diagram showing an igniter according to a fourth embodiment.

FIG. 7 shows an equivalent circuit of an igniter of the present embodiment. In FIG. 7, component elements identical to those in FIGS. 1 to 6 are designated by the identical reference numerals. In the present embodiment, the gate of the MOSFET 701 is connected to the output terminal of the constant-voltage circuit 111 to maintain current flowing through the MOSFET 104 constant.

The description will be made of an operation of the present embodiment. When input voltage is applied, the IGBT operates so that collector current starts to flow. When the collector current exceeds a predetermined current value, a constant current control circuit operates to limit the collector current constant. Then, voltage is developed at a node between the resistors 101 and 102, and the MOSFET 104 is turned on to flow vibration inhibition current. Since the gate voltage of the MOSFET 701 is determined by output from the constant voltage circuit 111, this vibration inhibition current is capable of supplying a fixed amount of current. With such structure, it is possible to supply stable vibration inhibition current and to inhibit variations in limited current value, and therefore, the current capacity of the IGBT can be reduced and the chip can be downsized.

(Fifth Embodiment)

Figure 8:
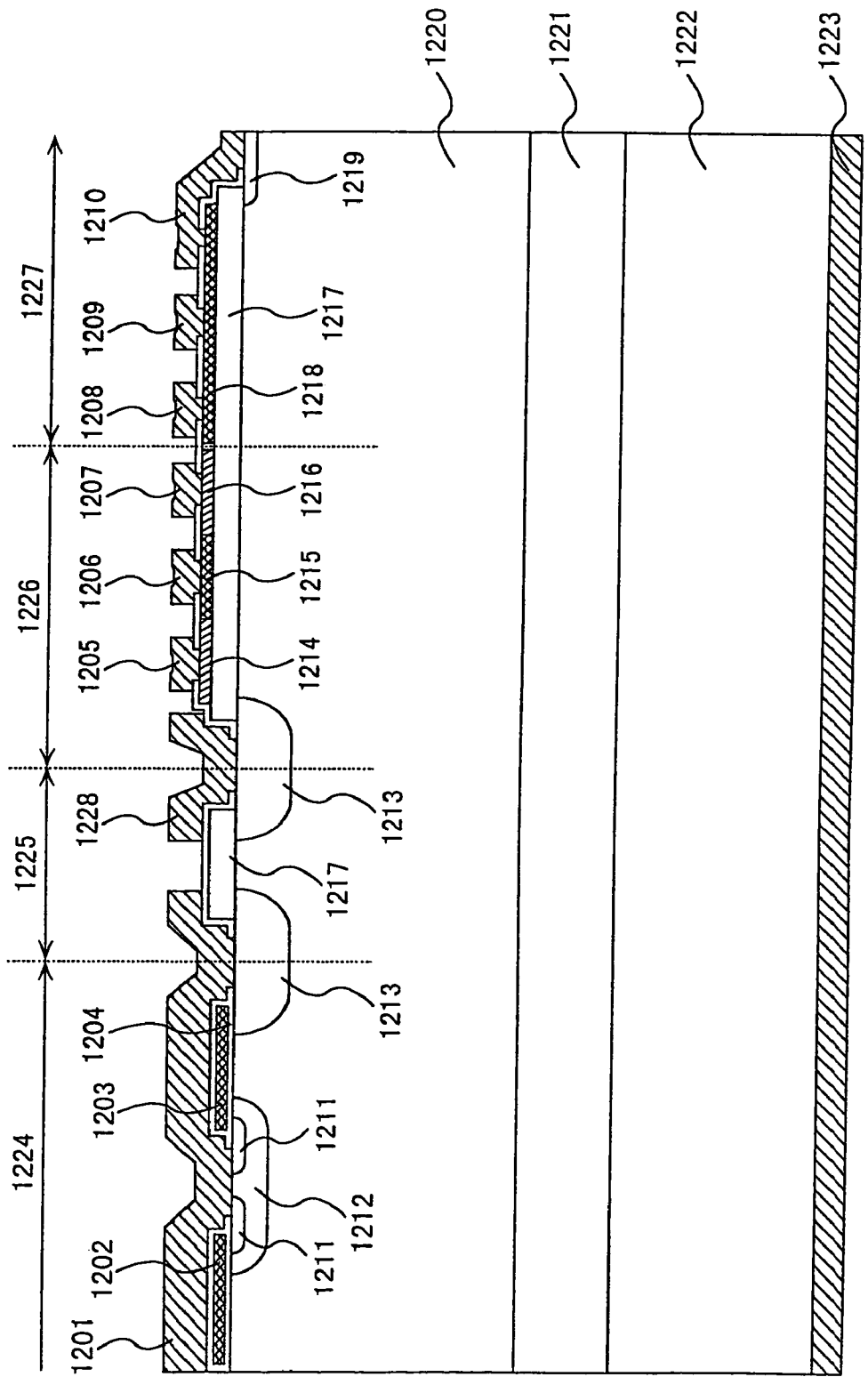
FIG. 8 is a cross-sectional schematic diagram showing IGBT according to a fifth embodiment.

FIG. 8 is a cross-sectional view showing the IGBT for an igniter according to the present embodiment. In the present embodiment, since a circuit has been constructed on an oxide on the surface of a chip, it can be rendered as one-chip by an ordinary manufacturing process, and since a circuit device is separated by the oxide, there is no parasitic operation.

In FIG. 8, reference numeral 1201 designates an emitter electrode; 1202, a gate electrode; 1203, an interlayer dielectric; 1204, a gate oxide; 1205, a source electrode of MOSFET; 1206, a gate electrode of MOSFET; 1207, a drain electrode of MOSFET; 1208, an emitter-side electrode of resistor; 1209, an intermediate electrode of resistor; 1210, a guard ring; 1211, a n-type source layer of IGBT; 1212, a p-type base layer; 1213, a p-type FLR layer; 1214, a n-type source layer of MOSFET; 1215, a channel layer of MOSFET; 1216, n-type drain layer; 1218, a polysilicon resistor; 1219, a n-type channel stopper layer; 1220, a n-type drift layer; 1221, a n-type buffer layer; 1222, a p-type collector layer; 1223, a collector electrode; 1224, an IGBT domain; 1225, a withstand voltage retaining domain; 1226, a vibration inhibition current supply circuit; and 1227, a collector voltage monitor circuit. The n-type drift layer 1220 is formed with the p-type base layer 1212, and within this p-type base layer 1212, there is formed the n-type source layer 1211. On the n-type drift layer 1220, there is formed the gate electrode 1202 through the gate oxide 1204. Further, on the gate electrode 1202, there is formed the interlayer dielectric 1203, on top of which the emitter electrode 1201 is formed such that the p-type base layer 1212 and the n-type source layer 1211 are short-circuited. The above is the IGBT domain 1224.

Next, the description will be made of an operation of the IGBT. With respect to the emitter electrode 1201, when positive voltage is applied to the collector electrode 1223 and the gate electrode 1202, a surface portion of the p-type base layer 1212 which has been formed below the gate electrode 1202 through the gate oxide 1219 is formed with a channel domain, and electronic current flows from the n-type source layer 1211 to the n-type drift layer 1220 through the channel domain. This electronic current becomes base current of a pnp bipolar transistor to be formed by the p-type base layer 1212, the n-type drift layer 1220 and the p-type collector layer 1222, and this pnp bipolar transistor is turned on and hole flows from the collector electrode 1223 to the emitter electrode 1201. This hole current and the electronic current become conductive current of the IGBT.

When turning the IGBT off, the potential at the gate electrode 1202 is set to 0 or a negative value. Thereby, the channel domain below the gate electrode 1202 disappears to cut off the electronic current. When the supply of the electronic current is suspended, the hole current is also cut off to turn the IGBT off. As described above, when the IGBT is on, the holes are injected from the p-type collector layer 1222 to the n-type drift layer 1220, and the holes are accumulated within the n-type drift layer 1220 of high resistance. These accumulated holes greatly reduce resistance of the n-type drift layer 1220 of high resistance; a so-called electric conductivity modulation phenomenon occurs to make it possible to reduce the on-voltage.

In the collector voltage monitor circuit 1227, there is formed an oxide 1217 on the n-type drift layer 1220. Further, on the oxide 1217, there is formed a polysilicon resistor 1218, one of the polysilicon resistor 1218 is formed so as to come into contact with a guard ring 1210, and the electrode is formed in such a manner that the other becomes at the same potential as the gate electrode 1202 of the IGBT. Also, at the middle point of the polysilicon resistor 1218, there is formed an electrode so as to connect to the gate electrode 1206 of MOSFET.

The description will be made of an operation of the collector voltage monitor circuit 1227. When the collector voltage is raised, collector voltage is developed at the guard ring through the p-type collector layer 1222, the n-type buffer layer 1221, the n-type drift layer, and the n-type channel stopper layer, and is applied to the polysilicon resistor 1218. Then, at the middle point of the polysilicon resistor 1218, there occurs a voltage signal.

In a vibration inhibition current supply MOSFET, there is formed an oxide 1217 on the n-type drift layer 1220, and on top of the oxide 1217, there is formed polysilicon. On the polysilicon, there are formed the n-type source layer 1214 of MOSFET selectively formed and the n-type drain layer 1216 of MOSFET. The p-type channel layer 1215 is formed in a region to be interposed between the n-type source layer 1214 of MOSFET and the n-type drain layer 1216 of MOSFET.

The description will be made of an operation of the vibration inhibition current supply MOSFET. When a signal is applied from the collector voltage monitor circuit 108, the vibration inhibition current supply MOSFET is turned on to supply current. A time period during which the current is supplied is only a time period during which input voltage is applied to raise the collector voltage.

According to the present sample as described above, since the circuit device can be formed on the oxide and any parasitic operation of the circuit is not present, the degree of freedom in the component elements of the circuit is increased, and it is possible to make the circuit smaller in size and to downsize the chip.

(Sixth Embodiment)

Figure 9:
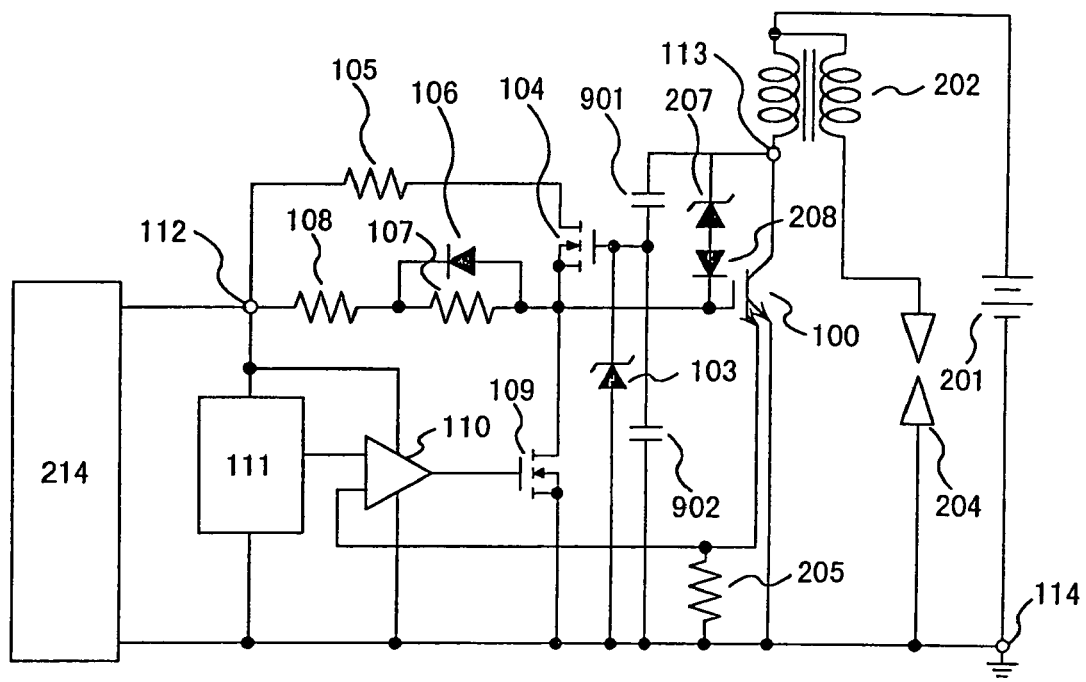
FIG. 9 is a circuit diagram showing an igniter according to a sixth embodiment.

FIG. 9 shows a circuit diagram of an igniter according to the present embodiment. In FIG. 9, component elements identical to those in FIGS. 1 to 8 are designated by the identical reference numerals. The description will be made of the structure of FIG. 9. Between collector and emitter of the IGBT, there are series-connected capacitors 901 and 902, and this node is connected to the gate of the MOSFET 104. In the present embodiment, collector-emitter voltage has been divided by the capacitors. By dividing by the capacitors, leakage current in an off-state of IGBT in which leakage current from the collector causes the problem can be eliminated.

(Seventh Embodiment)

Figure 10:
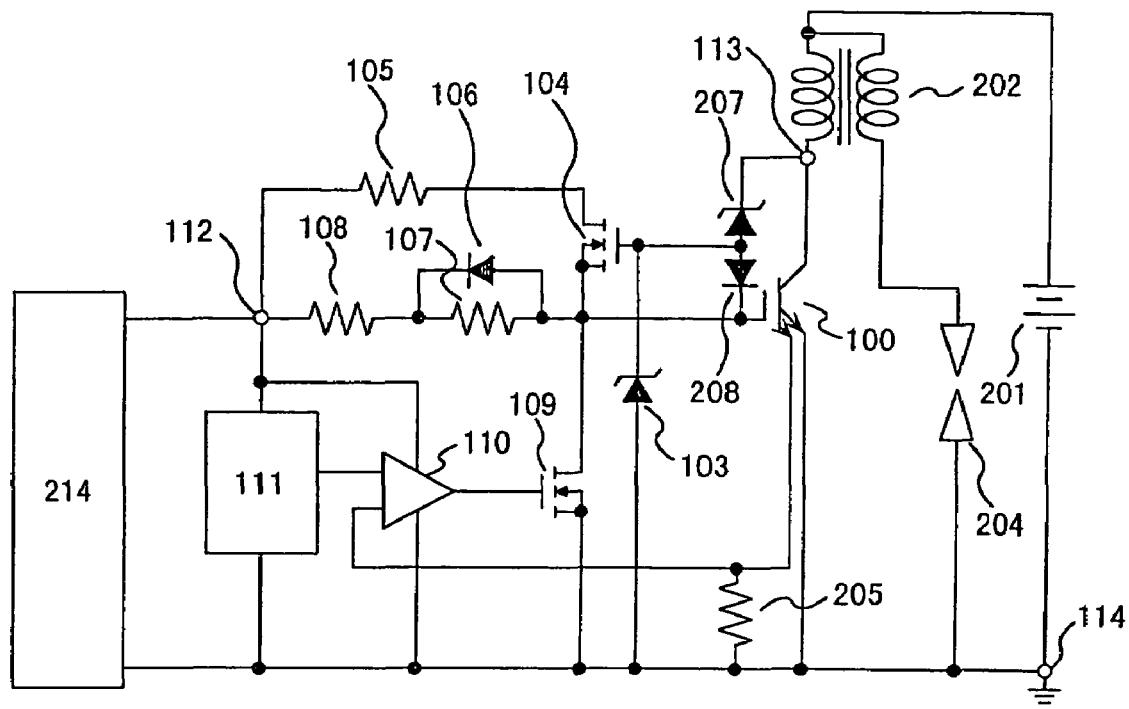
FIG. 10 is a circuit diagram showing an igniter according to a seventh embodiment.

FIG. 10 shows an equivalent circuit of an igniter according to the present embodiment. In FIG. 10, component elements identical to those in FIGS. 1 to 9 are designated by the identical reference numerals. The description will be made of the structure of FIG. 10. The Zener diode 207 is constructed such that diodes, each having several volts per step are connected in several tens of steps in series in reverse order. The structure is arranged such that a terminal is provided at a place corresponding to several steps, and the terminal is connected to the gate terminal of the gate current control MOSFET 104. In the present embodiment, a terminal is provided at a portion of a clamp diode, and this terminal is used as the collector voltage monitor circuit, whereby the circuit area becomes smaller and the chip can be miniaturized. Also, since the collector current can be also reduced, it becomes possible to screen the IGBT, and an initial failure can be detected.

According to the present embodiment as described above, the circuit area becomes smaller, the chip size can be made smaller, and the cost can be reduced. Also, since the collector leakage current can be reduced and the characteristic of the IGBT body can be evaluated, it becomes possible to detect the failure, and the reliability is improved. Further, since the collector leakage current is reduced, the arc energy is increased, and the combustion efficiency is improved. For this reason, the fuel consumption is reduced.

The invention claimed is:

1. An onboard igniter, characterized by including: a pair of main terminals for carrying main current; an insulated gate semiconductor device having a control terminal for controlling said main current; a current detection terminal; a current control circuit for limiting said main current by controlling voltage of a control electrode when said main current exceeds a fixed value; a voltage monitor circuit for detecting voltage of said pair of main terminals; and a control current adjusting circuit for controlling current for flowing through said control terminal by receiving output from said voltage monitor circuit; said voltage monitor circuit is a series circuit having at least two resistors connected between said pair of main terminals, and outputs potential at a node of this series circuit.

2. The onboard igniter according to claim 1, characterized in that said control current adjusting circuit comprises: control electrode resistance connected to said control terminal; and a by-pass circuit, to which is connected in parallel with said control electrode resistance, and which flows current when a signal is outputted from said voltage monitor circuit.

3. The onboard igniter according to claim 2, characterized in that said by-pass circuit has a MOSFET in which a drain is connected to one terminal of said control electrode resistance, a source is connected to the other terminal of said control electrode resistance, and a gate is connected to output of said voltage monitor circuit.

4. The onboard igniter according to claim 3, characterized in that a series circuit is connected between the drain of said MOSFET of said by-pass circuit and one terminal of said control electrode resistance.

5. The onboard igniter according to claim 3, characterized in that a diode for limiting potential of said gate constant is connected between said gate of MOSFET and a terminal having lower potential of said pair of main terminals.

6. The onboard igniter according to claim 3, characterized in that a series circuit is connected between the drain of MOSFET of said by-pass circuit and one terminal of said control electrode resistance, and that a gate of said current limiting MOSFET is connected to an output of a constant-voltage regulated power supply.

7. The onboard igniter according to claim 1, characterized in that said insulated gate semiconductor device is an insulated gate bipolar transistor (IGBT).

8. The onboard igniter according to claim 1, characterized in that said voltage monitor circuit is constructed to detect potential from a portion of a Zener diode.

9. An onboard igniter, characterized by including: a pair of main terminals for carrying main current; an insulated gate semiconductor device having a control terminal for controlling said main current; a current control circuit for limiting said main current by controlling voltage of a control electrode when said main current exceeds a fixed value; a voltage monitor circuit for detecting voltage of said pair of main terminals; and a control current adjusting circuit for controlling current for flowing through said control terminal by receiving output from said voltage monitor circuit; said control electrode adjusting circuit has a MOSFET in which a drain is connected to a power circuit, a source is connected to said control electrode, and a gate is connected to output of said voltage monitor circuit.

10. An onboard igniter, characterized by including: a pair of main terminals for carrying main current; an insulated gate semiconductor device having a control terminal for controlling said main current; a current control circuit for limiting said main current by controlling voltage of a control electrode when said main current exceeds a fixed value; a voltage monitor circuit for detecting voltage of said pair of main terminals; and a control current adjusting circuit for controlling current for flowing through said control terminal by receiving output from said voltage monitor circuit; said voltage monitor circuit is a series circuit having at least two resistors connected between a terminal of said pair of main terminals, higher in potential and said control terminal, and outputs potential at a node of this series circuit.

11. An IGBT for an onboard igniter, characterized by being constituted such that:

there are provided a semiconductor substrate having a pair of main surfaces, a first layer of one-way conductive type which is adjacent to one main surface of said semiconductor substrate, and a second layer of a second conductive type which has been formed adjacent the other main surface and said first layer of said semiconductor substrate;

said semiconductor substrate has a first domain and a second domain which are adjacent to each other;

on the other main surfaces of said first domain and said second domain, there are provided first electrodes;

on said first domain, within its first layer, there are provided a third layer of the other conductive type to be selectively formed adjacent to one main surface, a fourth layer of one-way conductive type to be selectively formed adjacent to one main surface within the third layer, and a fifth layer of one-way conductive type to be selectively formed apart from the fourth layer of one-way conductive type within the third layer of the other conductive type, adjacent to one main surface within the first layer;

on one main surface, there are provided a second electrode which comes into contact with the third layer and the fourth layer, and a first control electrode to be formed, through a dielectric film, on an exposure portion of the third layer on the opposite side to the second electrode on one main surface, on said second domain, within the first layer, there are formed a sixth layer of the other conductive type to be selectively formed adjacent to one main surface, and a first semiconductor layer, through a dielectric film, on one main surface of the sixth layer; there are formed a seventh layer of the other conductive type and an eighth layer to be selectively formed on said first semiconductor layer, and a ninth layer of one-way conductive type to be interposed between the seventh layer of the other conductive type and the eighth layer; there is formed a second semiconductor layer apart from said first semiconductor layer; and there are provided a tenth layer of one-way conductive type to be selectively formed on said second semiconductor layer and an eleventh layer of one-way conductive type to be selectively formed adjacent said first main surface, in the first semiconductor layer on one main surface, there are provided a third electrode for connecting to the first control electrode of the first domain which comes into contact with the seventh layer, a fourth electrode which comes into contact with the eighth layer, a second control electrode to be formed, through a dielectric film, on an exposure portion of the ninth layer, and in the second semiconductor layer on one main surface, on the one hand, a fifth electrode which comes into contact with the tenth layer, on the other hand, a sixth electrode which comes into contact with the tenth layer and connects to the eleventh layer, and a seventh electrode which comes into contact with the tenth layer to be interposed between the fifth electrode and the sixth electrode, and the second electrode of said first domain is connected to the third electrode of said second domain, the first control electrode of said first domain is connected to the eighth electrode of said second domain, and the seventh electrode of said second domain is connected to the second control electrode.

12. An onboard igniter, characterized by including: a pair of main terminals for carrying main current; an insulated gate semiconductor device having a control terminal for controlling said main current; a current control circuit for limiting said main current by controlling voltage of a control electrode when said main current exceeds a fixed value; a voltage monitor circuit for detecting voltage of said pair of main terminals; and a control current adjusting circuit for controlling current for flowing through said control terminal by receiving output from said voltage monitor circuit; said voltage monitor circuit is a series circuit of at least two capacitors connected between said pair of main terminals, and outputs potential at a node of this series circuit.

* * * * *